(12) United States Patent
Song et al.

(10) Patent No.: US 10,372,000 B2
(45) Date of Patent: Aug. 6, 2019

(54) ARRAY SUBSTRATE AND METHOD OF MANUFACTURING THE SAME, AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Botao Song, Beijing (CN); Liang Lin, Beijing (CN); Tao Ma, Beijing (CN); Wenlong Wang, Beijing (CN); Ling Han, Beijing (CN); Yu Wei, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/531,294

(22) PCT Filed: May 20, 2016

(86) PCT No.: PCT/CN2016/082791
§ 371 (c)(1),
(2) Date: May 26, 2017

(87) PCT Pub. No.: WO2017/166398
PCT Pub. Date: Oct. 5, 2017

(65) Prior Publication Data
US 2018/0173068 A1    Jun. 21, 2018

(30) Foreign Application Priority Data
Mar. 31, 2016    (CN) .......................... 2016 1 0200608

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1362* (2013.01); *G02F 1/1368* (2013.01);
(Continued)

(58) Field of Classification Search
None
See application file for complete search history.

(56) References Cited

U.S. PATENT DOCUMENTS 6,288,765 B1    9/2001    Tanaka et al.
6,995,048 B2    2/2006    Yoneda et al.
(Continued)

FOREIGN PATENT DOCUMENTS

CN    1351319 A    5/2002
CN    1462481 A    12/2003
(Continued)

OTHER PUBLICATIONS

International Search Report and Written Opinion for International Application No. PCT/CN2016/082791, dated Dec. 16, 2016, 9 pages.
(Continued)

*Primary Examiner* — Alexander G Ghyka
(74) *Attorney, Agent, or Firm* — Westman, Champlin & Koehler, P.A.

(57) ABSTRACT

There is disclosed a method of manufacturing an array substrate, the method including a step of forming thin film transistors on a substrate; wherein the step of forming the thin film transistors on the substrate includes: forming a first electrically conductive layer on the substrate; forming an insulating layer on the first electrically conductive layer;
(Continued)

forming at least one common holes in the insulating layer to communicate with the first electrically conductive layer; forming a first connection portion, which is made of the same material as a second electrically conductive layer, in the at least one of the at least one common holes while forming the second electrically conductive layer on the insulating layer by using a single process, the first connection portion being in electrical contact with the first electrically conductive layer. In addition, there is disclosed an array substrate manufactured by the above method and a display device including the array substrate.

9 Claims, 8 Drawing Sheets (51) Int. Cl.
G02F 1/1343 (2006.01)
G02F 1/1368 (2006.01)
(52) U.S. Cl.
CPC .... *G02F 1/13439* (2013.01); *G02F 1/134363* (2013.01); *H01L 27/12* (2013.01); *G02F 1/134336* (2013.01); *G02F 2001/13685* (2013.01); *G02F 2001/134372* (2013.01); *G02F 2001/136295* (2013.01); *G02F 2201/121* (2013.01)

(56) References Cited

U.S. PATENT DOCUMENTS

| 9,165,949 B1 | 10/2015 | Bai et al. |
| 2014/0167031 A1* | 6/2014 | Choi ................. H01L 21/02565 257/43 |
| 2017/0053939 A1 | 2/2017 | Jiang et al. |

FOREIGN PATENT DOCUMENTS

| CN | 101546076 A | 9/2009 |
| CN | 103972243 A | 8/2014 |
| CN | 105047722 A | 11/2015 |

OTHER PUBLICATIONS

English translation of International Search Report and Written Opinion for International Application No. PCT/CN2016/082791, 14 pages.

* cited by examiner

ARRAY SUBSTRATE AND METHOD OF MANUFACTURING THE SAME, AND DISPLAY DEVICE

CROSS-REFERENCE TO RELATED APPLICATIONS

The present application is a Section 371 National Stage application of International Application No. PCT/CN2016/082791, filed 20 May 2016, which has not yet published, and claims priority to Chinese Patent Application No. 201610200608.8, filed on Mar. 31, 2016, entitled "array substrate and method of manufacturing the same, and display device", which are incorporated herein by reference in their entirety.

BACKGROUND

1. Technical Field

The present disclosure relates to technical field of liquid crystal display, and particularly to an array substrate and a method of manufacturing the same and a display device including the array substrate.

2. Description of the Related Art

In liquid crystal display technology, common electrodes may be configured at a side of a color film substrate or at a side of an array substrate. In the case where the common electrodes are configured at a side of the array substrate (bottom-gate structure), a section drop of a common hole in the common electrodes is substantially a sum of thicknesses of a gate insulating layer, an etch barrier layer and a passivation layer and thus a hole depth of the common holes is rather deep, i.e., the section drop between inside and outside of the hole is rather great. Subsequently, during the subsequent assembling of cells, when the PI solution is used to form a guide film, problems such as poor diffusion (for example, non-uniform) of PI solution at edges of the common holes in the common electrode will occur, and thus panel stain will appear.

A top-gate structure array substrate also involves the same problems. When forming connection holes in the gate insulating layer to electrically connect with the source/drain electrodes of thin film transistors and a pixel electrode pattern/data line pattern, the problems such as poor diffusion (for example, non-uniform) of the PI solution at edges of the connection holes in the common electrode will also occur and thus panel stain will appear.

SUMMARY

It is found by the inventor of the present invention that, except improvement of coating of PI solution or metal solution, reducing section drop of common holes or connection holes also can eliminate problem of panel stain caused by poor diffusion of the PI solution or the metal solution on edges of the common holes or the connection holes. Thus, the present disclosure provides a method of manufacturing an array substrate to reduce panel stain by decreasing section drop of the common holes/connection holes.

Specifically, according to an aspect of the present disclosure, there is provided a method of manufacturing an array substrate, and the method comprises a step of forming thin film transistors on a substrate; wherein the step of forming the thin film transistors on the substrate comprises: forming a first electrically conductive layer on the substrate; forming an insulating layer on the first electrically conductive layer; forming at least one common holes in the insulating layer to communicate with the first electrically conductive layer; forming a first connection portion, which is made of the same material as a second electrically conductive layer, in the at least one of the at least one common holes while forming the second electrically conductive layer on the insulating layer by using a single process, the first connection portion being in electrical contact with the first electrically conductive layer.

In an embodiment, the first electrically conductive layer includes a common electrode pattern and a gate pattern of the thin film transistors, and the second electrically conductive layer includes a source electrode pattern and a drain electrode pattern of the thin film transistors and leading wires thereof, i.e., the array substrate is a bottom-gate array substrate. In this configuration, the step of forming the first connection portion, which is made of the same material as the second electrically conductive layer, in at least one of the at least one common holes while forming the second electrically conductive layer on the insulating layer comprises: forming the source electrode pattern and the drain electrode pattern of the thin film transistors and the leading wires thereof from metal material while forming the first connection portion in the at least one common holes from the metal material, the first connection portion being in electrical contact with the common electrode pattern.

In another embodiment, the first electrically conductive layer comprises the source electrode pattern, the drain electrode pattern of the thin film transistors and the leading wires thereof and the second electrically conductive layer comprises a gate pattern of the thin film transistors, i.e., the array substrate is of a top-gate structure. In the configuration, the step of forming the first connection portion, which is made of the same material as the second electrically conductive layer, in at least one of the at least one common holes while forming the second electrically conductive layer on the insulating layer comprises: forming the first connection portion from the metal material in at least one of the at least one common holes while forming the gate pattern of the thin film transistors from the metal material, the first connection portion being in electrical contact with one of the source electrode pattern and the drain electrode pattern.

According to another aspect of the present disclosure, there is provided an array substrate having a thin film transistor, and the array substrate includes: a first electrically conductive layer formed on a substrate; an insulating layer formed on the first electrically conductive layer; at least one common holes formed in the insulating layer, the at least one common holes being in electrical connection with the first electrically conductive layer; and a second electrically conductive layer formed on the insulating layer; wherein a first connection portion is formed in the at least common holes from the same material as the second electrically conductive layer while forming the second electrically conductive layer by using a single process, such that the first connection portion is in electrical contact with the first electrically conductive layer and a thickness of the first connection portion is the same as that of the second electrically conductive layer.

According to a still aspect, there is provided a display device including the above array substrate.

BRIEF DESCRIPTION OF THE DRAWINGS

Embodiments of the present disclosure will be described in exemplary manner by referring to the attached schematic drawings, in which the same reference symbol denotes the same or similar structure or component, and in which.

DETAILED DESCRIPTION OF THE EMBODIMENTS

Other features and advantages of various embodiments and structures and operations thereof will be described in detail with reference to the drawings. It is noted that the present invention is not limited to the embodiments in the specification. These embodiments are illustrated in the specification for illustration only. Based on the teaching included herein, it is obvious for those skilled in the art to obtain additional embodiments.

It is noted that "an/one embodiment", "embodiments" and "exemplary embodiment(s)" referred in the specification mean that the described embodiment may include specific feature, structure or characteristic, and however, it is not necessary that every embodiment includes the specific feature, structure or characteristic. Furthermore, the above wordings do not necessarily denote the same embodiment. In addition, it is understood that, when the specific feature, structure or characteristic are described in conjunction with embodiments, implementation of the specific feature, structure or characteristic by combining other embodiments whether it is definitely illustrated are within the knowledge of those skilled in the art.

Figure 1A:
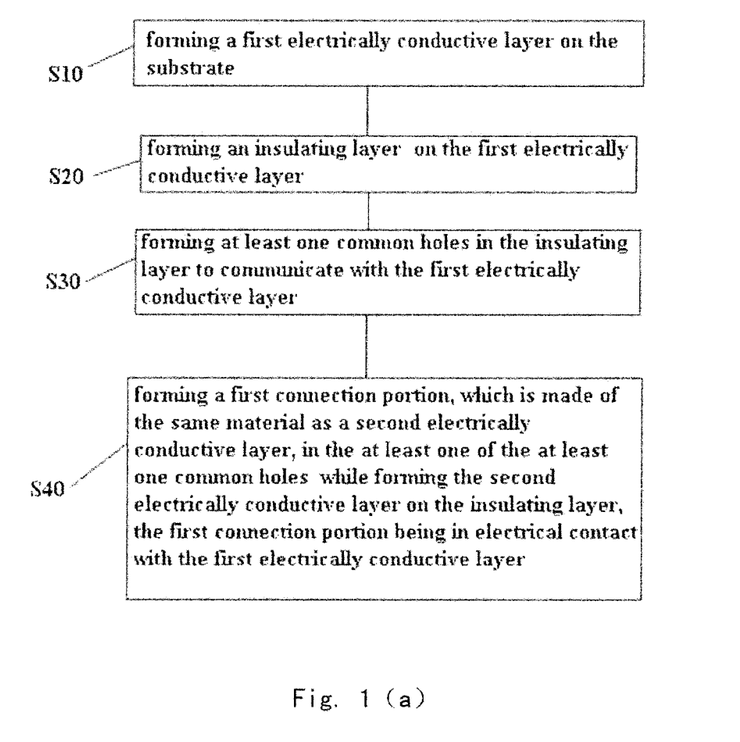
FIG. 1(a) is a flow chart of a method of manufacturing an array substrate according to an embodiment of the present disclosure.
Figure 1B:
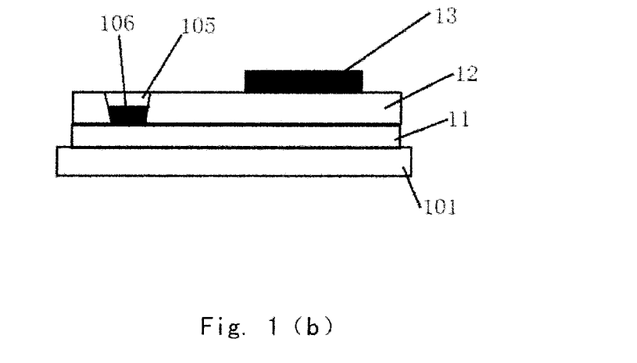
FIG. 1(b) is a schematic structural view of height of an array substrate corresponding to a process of manufacturing the array substrate according to the embodiment of the present disclosure.

As shown in FIGS. 1 (a) and 1(b), a method of manufacturing an array substrate according to an embodiment of the present disclosure includes: forming a thin film transistor on a substrate, wherein the step of forming the thin film transistors on the substrate includes:

S10: forming a first electrically conductive layer 11 on the substrate 101;

S20: forming an insulating layer 12 on the first electrically conductive layer 11;

S30: forming at least one common holes 105 in the insulating layer 12 to communicate with the first electrically conductive layer 11;

S40: forming a first connection portion 106, which is made of the same material as a second electrically conductive layer 13, in the at least one of the at least one common holes 105 while forming the second electrically conductive layer 13 on the insulating layer 12, the first connection portion 106 being in electrical contact with the first electrically conductive layer 11.

With the method of manufacturing an array substrate provided by the present disclosure, the first connection portion that is in electrical contact with the first electrically conductive layer is formed in the common holes such that a hole depth of the common holes is reduced due to a thickness of the first connection portion while maintaining electrical communication from the first connection portion to the electrically conductive layer, thereby reducing section drop of the common holes, alleviating problem of poor diffusion of PI solution or metal solution at edges of the common holes and thus reducing panel stain. In addition, as the first connection portion is formed in the common holes while forming the second electrically conductive layer, no additional process is needed and no product cost is increased.

A method of manufacturing an array substrate according to the embodiment of the present disclosure is described hereafter in detail based on a bottom-gate type array substrate structure by referring to FIGS. 2(a)~9(b).

In the bottom-gate type array substrate structure, the first electrically conductive layer 11 includes a common electrode pattern 102 and a gate pattern 102a of the thin film transistors, the second electrically conductive layer 13 includes a source electrode pattern 100a and a drain electrode pattern 100b of the thin film transistors and leading wires thereof, and the insulating layer 12 includes a gate insulating layer 103 or a gate insulating layer 103 and an etch barrier layer 104. The step of forming at least one common holes 105 in the gate insulating layer 103 to communicate with the first electrically conductive layer 11 includes: forming at least one common holes 105 in the gate insulating layer 103 or the gate insulating layer 103 and the etch barrier layer 104 to communicate with the first electrically conductive layer 11.

In an embodiment, the step of forming the first connection portion 106, which is made of the same material as the second electrically conductive layer 13, in at least one of the at least one common holes 105 while forming the second electrically conductive layer 13 on the insulating layer 12 includes: forming the source electrode pattern and the drain electrode pattern 100a and 100b of the thin film transistors and the leading wires thereof from metal material while forming the first connection portion 106 in at least one of the at least one common hole 105 from the metal material, the first connection portion 106 being in electrically contact with the common electrode pattern 102.

In an embodiment, the step of forming at least one common holes 105 in the gate insulating layer 103 or the gate insulating layer 103 and the etch barrier layer 104 to communicate with the first electrically conductive layer 11 includes:

forming the active layer pattern 103a at a location, corresponding to the gate pattern 102a, on the gate insulating layer 103;

forming an etch barrier layer 104 on the substrate obtained;

forming at least one common holes 105, at locations of the etch barrier layer 104 corresponding to the common electrode pattern 102, the at least one common holes 105 being communicated with the common electrode pattern 102.

Figure 2A:
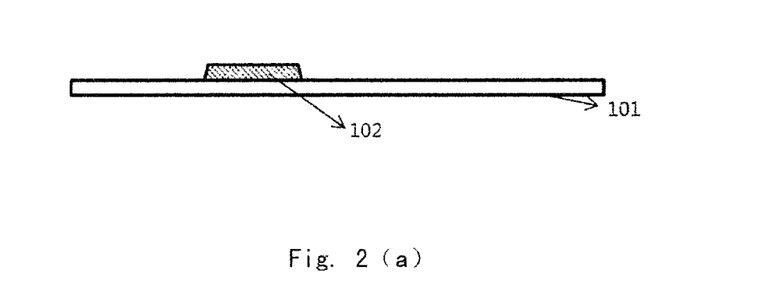
FIGS. 2(a)~(b) are a cross section view and a top view of a first structure of the array substrate corresponding to the process of manufacturing the array substrate according to the embodiment of the present disclosure, in which the array substrate is of a bottom-gate structure.
Figure 2B:
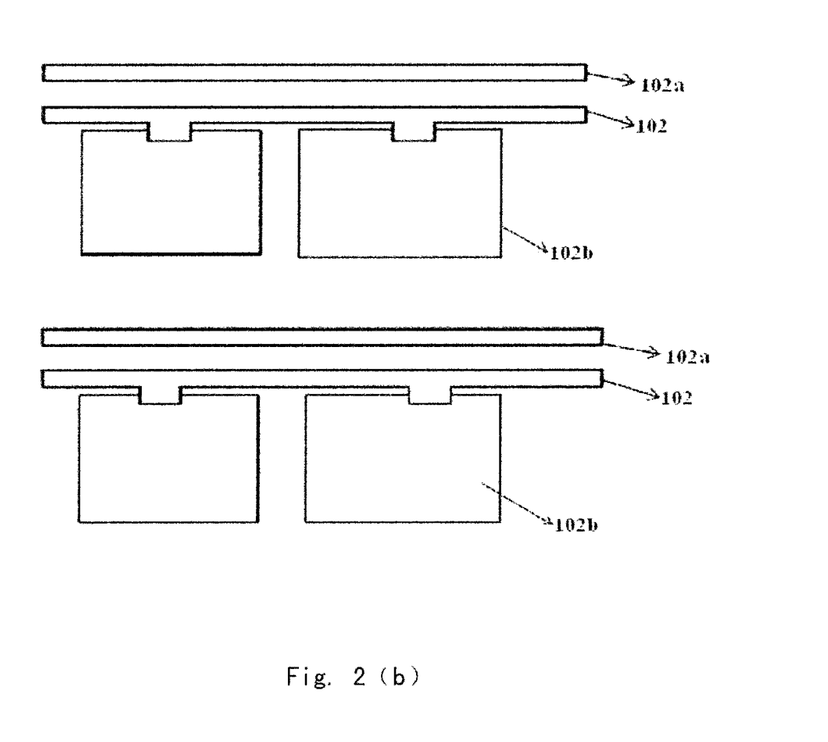
Figure 3:
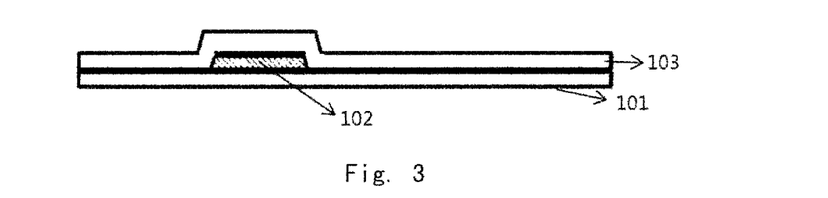
FIG. 3 is a cross section view of a second structure of the array substrate corresponding to the process of manufacturing the array substrate according to the embodiment of the present disclosure, in which the array substrate is of a bottom-gate structure.
Figure 4A:
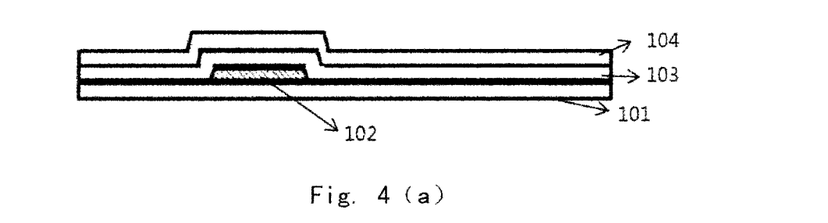
FIGS. 4(a)~(b) are a cross section view and a top view of a third structure of the array substrate corresponding to the process of manufacturing the array substrate according to the embodiment of the present disclosure, in which the array substrate is of a bottom-gate structure.
Figure 4B:
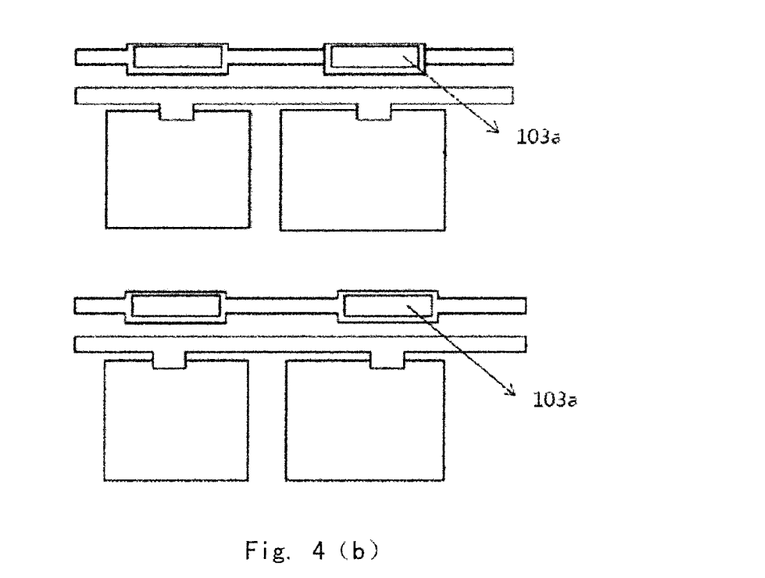
Figure 5A:
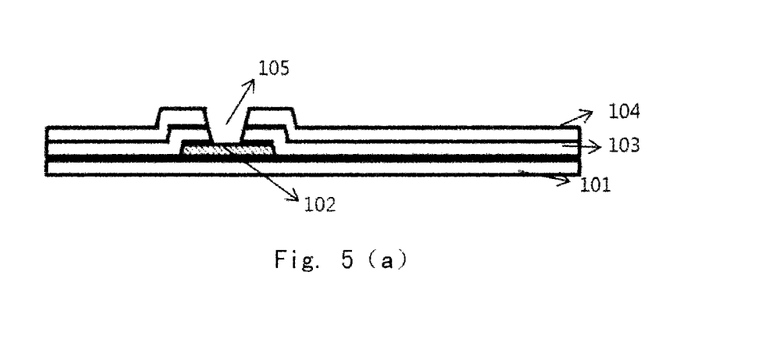
FIGS. 5(a)~(b) are a cross section view and a top view of a fourth structure of the array substrate corresponding to the process of manufacturing the array substrate according to the embodiment of the present disclosure, in which, for convenience of illustration, the gate insulating layer and the etch barrier layer are not shown in the top view, and in which the array substrate is of a bottom structure.
Figure 5B:
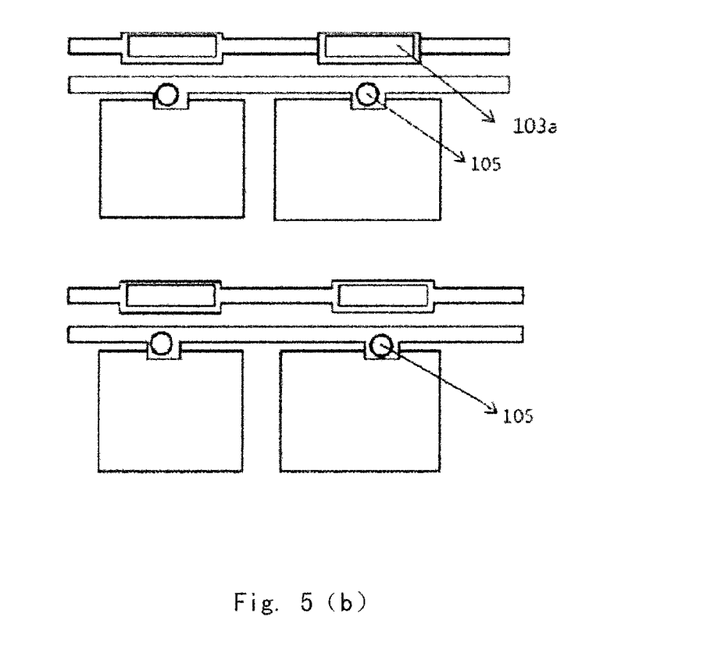
Figure 6A:
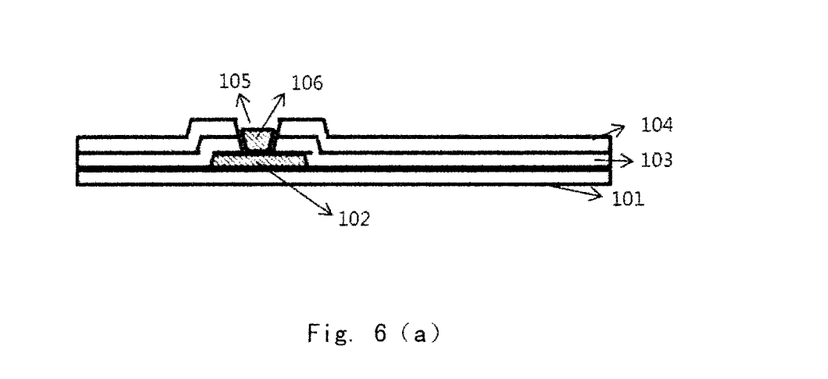
FIGS. 6(a)~(b) are a cross section view and a top view of a fifth structure of the array substrate corresponding to the process of manufacturing the array substrate according to the embodiment of the present disclosure, in which, for convenience of illustration, the gate insulating layer and the etch barrier layer are not shown in the top view, and in which the array substrate is of a bottom structure.
Figure 6B:
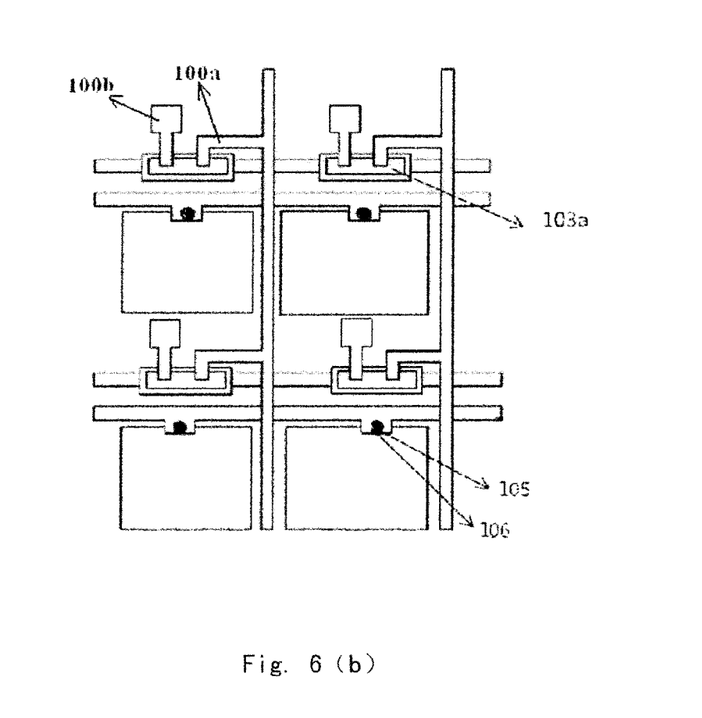

In a specific embodiment, for example, referring to FIGS. 2(a)-5(b), the step of forming the common holes includes:

S201: forming a gate pattern 102a and the common electrode pattern 102, corresponding to the gate pattern 102a, on the substrate 101, as shown in FIGS. 2(a) and 2(b), wherein 102b denotes tin indium oxide (ITO) common electrode;

S202: forming a gate insulating layer 103 on the substrate 101, on which the gate pattern 102a and the common electrode pattern 102, corresponding to the gate pattern 102a, are formed, as shown in FIG. 3;

S203: forming an active layer pattern 103a on a location of the gate insulating layer 103 corresponding to the gate pattern 102a, for example, as shown in FIG. 4(b);

S204: forming an etch barrier layer 104 on the substrate obtained, as shown in FIG. 4(a);

S205: forming the at least one common holes 105 on the locations of the etch barrier layer 104 corresponding to the plurality of common electrode patterns 102, the at least one common holes 105 being forming as through-holes communicated with the common electrode patterns 102, as shown in FIGS. 5(a) and 5(b);

S206: forming the source electrode 100a and the drain electrode 100b and the leading wires thereof from metal material on the active layer pattern 103a, as shown in FIG. 6(b).

During the above process steps, the first connection portion 106 is formed from a metal material in the at least one common electrode holes 105 through a single process while forming the source electrode 100a and the drain electrode 100b and the leading wires thereof of the active layer pattern 103a, from the same metal material, as shown in FIG. 6(a), the first connection portion 106 being in electrical connection with the common electrode pattern 102.

Compared with the prior art, according to the above embodiments, during manufacturing the array substrate, the common holes are formed while forming the thin film transistor array, instead of forming the common holes after having formed the thin film transistor array, thereby reducing section drop of the common holes.

It is noted that, in the above embodiments, the etch barrier layer 104 is remained, and, however, it is not necessary and the etch barrier layer 104 may be removed after having formed the common holes 105, so as to further reduce the section drop of the common electrode holes. In addition, the above steps may be performed by using any suitable known processes in prior art, for example, the common holes may be formed in the common electrodes by wet etching process.

In an embodiment, as the source electrode 100a and the drain electrode 100b and the leading wires thereof, together with the first connection portion 106, are formed by a single process, thicknesses of the source electrode 100a and the drain electrode 100b and the first connection portion 106 are the same.

Figure 7:
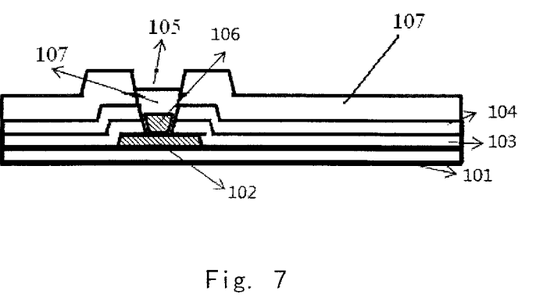
FIG. 7 is a cross section view of a sixth structure of the array substrate corresponding to the process of manufacturing the array substrate according to the embodiment of the present disclosure, in which the array substrate is of a bottom-gate structure.
Figure 8:
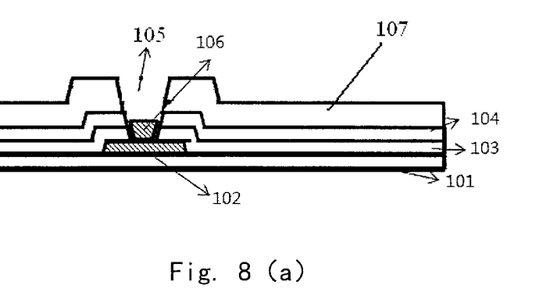
FIGS. 8(a)~(b) are a cross section view and a top view of a seventh structure of the array substrate corresponding to the process of manufacturing the array substrate according to the embodiment of the present disclosure, in which, for convenience of illustration, the gate insulating layer, the etch barrier layer and the passivation layer are not shown in the top view, and in which the array substrate is of a bottom structure.
Figure 9:
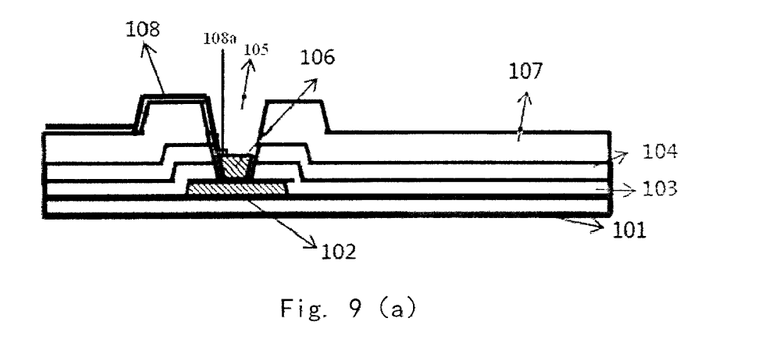
FIGS. 9(a)~(b) are a cross section view and a top view of an eighth structure of the array substrate corresponding to the process of manufacturing the array substrate according to the embodiment of the present disclosure, in which, for convenience of illustration, the gate insulating layer, the etch barrier layer and the passivation layer are not shown in the top view, and in which the array substrate is of a bottom structure.

In an embodiment, referring to FIGS. 7-9(b), the method of manufacturing an array substrate may further include the following steps of:

S50: forming a passivation layer 107 in the common holes 105 and on the substrate 101, on which the first connection portion 106 is formed, the passivation layer 107 covering the first connection portion 106, as shown in FIG. 7;

S60: etching a portion of the passivation layer 107 corresponding to the first connection portion 106 to expose the first connection portion 106, and etching and forming through-holes 107a, in locations of the passivation layer 107 corresponding to the drain electrodes 100b, to communicate with the drain electrodes 100b, as shown in FIGS. 8(a) and 8(b);

S70: forming pixel electrodes 109, which is electrically connected with the drain electrodes 100b, on the passivation layer 107 through the through-holes 107a, as shown in such as FIG. 9(b); and S80: forming at least one common electrode connection lines 108 on the passivation layer 107, the common electrode connection lines 108 each being in electrical contact with the at least one common electrode patterns 102, as shown in FIG. 9(a).

It is noted that the common electrodes in the drawings may be in electrical contact with each other and be electrically re-connected through respective common electrode connection lines extending on the passivation layer. Optionally, at least one of the common electrodes is not in electrical communication, and a common electrode hole is formed correspondingly to each of the at least one of the common electrodes such that electrical communication of the whole common electrode pattern may be obtained by the first connection portion in the common electrode holes and a plurality of common electrode connection lines, thereby forming a common electrode layer.

In addition, the above steps may be performed by using any known suitable processes in prior art. For example, the portions of the passivation layer corresponding to the first connection portion may be removed by dry etching process to expose the first connection portion.

Figure 10:
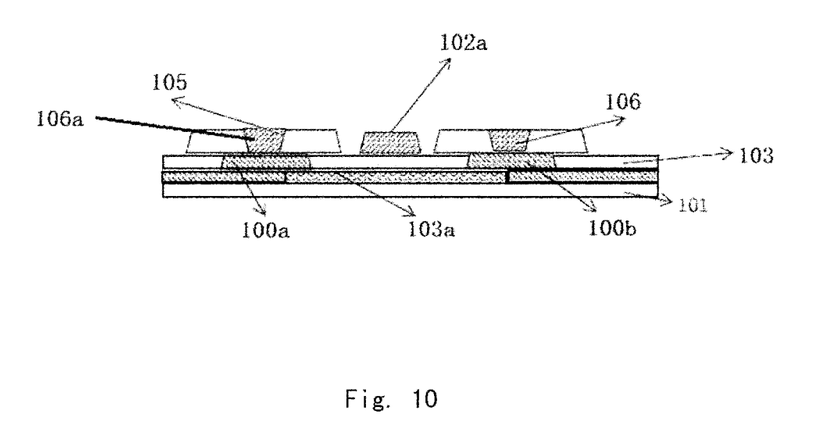
FIG. 10 is a cross section view of a partial schematic structure of a to-gate array substrate manufactured by the method of manufacture an array substrate according to embodiments of the present disclosure.

A specific method of manufacturing an array substrate according to an embodiment of the present disclosure is described based on a top-gate array substrate structure with reference to FIG. 10.

In the top-gate array substrate structure, a first electrically conductive layer 11 includes a source electrode pattern 100a and a drain electrode pattern 100b of thin film transistors and leading wires thereof, the second electrically conductive layer 13 includes a gate pattern 102*a* of the thin film transistors, and an insulating layer 12 includes a gate insulating layer 103. In this configuration, the step of forming the first connection portion 106, which is made of the same material as the second electrically conductive layer 13, in at least one of the at least one common holes 105 while forming the second electrically conductive layer 13 on the insulating layer 12 includes: forming the first connection portion 106 from the metal material in at least one of the at least one common holes 105 while forming the gate pattern 102*a* of the thin film transistor from the metal material, the first connection portion 106 being in electrical contact with one of the source electrode pattern 100*a* and the drain electrode pattern 100*b*.

In an another embodiment, the method of manufacturing the top-gate array substrate may further include: forming a second connection portion 106*a* from the same material as the second electrically conductive layer 13 in the rest of the at least one common holes 105 while forming the second electrically conductive layer 13 on the insulating layer. Further, the step of forming the second connection portion 106*a* from the same material as the second electrically conductive layer 13 in the rest of the at least one common holes 106 while forming the second electrically conductive layer 13 on the insulating layer 12 includes: forming the second connection portion 106*a* from the metal material in the rest of the at least one common holes 105 while forming the gate pattern 102*a* of the thin film transistors from the metal material, the second connection portion 106*a* being in electrical contact with the other of the source electrode pattern and the drain electrode pattern.

In an embodiment, the step of forming the at least one common holes 105 on the insulating layer (the gate insulating layer 103) to communicate with the first electrically conductive layer (the source electrode pattern and drain electrode pattern 100*a* and 100*b* of the thin film transistors) includes: forming the at least one common holes 105 at locations of the gate insulating layer 103 corresponding to the source electrode pattern and the drain electrode pattern to communicate with the source electrode pattern and the drain electrode pattern 100*a* and 100*b* of the thin film transistors.

In a specific embodiment, the active layer pattern 103*a* and the source electrode pattern and drain electrode pattern 100*a* and 100*b* are firstly formed on the substrate 101, the gate insulating layer 103 and the etch barrier layer 104 are formed on the source electrode pattern and drain electrode pattern 100*a* and 100*b*, and then the at least one common holes 105 are formed in the gate insulating layer 103 through the etch barrier layer 104. After removing the etch barrier layer 104, the first connection portion 106 is formed in the at least one common holes 105 while forming the gate pattern 102*a*. Material and thickness of the first connection portion 106 are the same as the gate pattern 102*a*.

In an embodiment, the method of manufacturing the top-gate array substrate further includes: forming a passivation layer (not shown) on the second electrically conductive layer, the passivation layer covering the first connection portion 106; etching and removing a portion of the passivation layer corresponding to the first connection portion 106 to expose the first connection portion 106; and, forming a pixel electrode pattern and/or a data line pattern (not shown), which are respectively in electrical connection with the drain electrode pattern 100*b* and/or the source electrode pattern 100*a* through the common holes and the first connection portion 106 in the common holes 105, on the passivation layer. In a preferred embodiment, the pixel electrode pattern and the data line pattern (not shown) are formed on the passivation layer and are respectively in electrical connection with the drain electrode pattern 100*b* and the source electrode pattern 100*a* through the common holes 105 and the first connection portion and the second connection portion 106*a* in the common holes 106.

According to another aspect, there is further provided an array substrate according to an embodiment of the present disclosure, and the array substrate includes: a first electrically conductive layer 11 formed on a substrate 101; an insulating layer 12 formed on the first electrically conductive layer 11; at least one common holes 105 formed in the insulating layer 12, the at least one common holes 105 being in connection with the first electrically conductive layer 11; and, a second electrically conductive layer 13 formed on the insulating layer 12; wherein a first connection portion 106 is formed in the at least common holes 105 from the same material as the second electrically conductive layer 13 while forming the second electrically conductive layer 13 by using a single process, such that the first connection portion 106 is in electrical contact with the first electrically conductive layer 11 and a thickness of the first connection portion 106 is the same as that of the second electrically conductive layer 13.

In an embodiment, for example, in a bottom-gate array substrate, the first electrically conductive layer 11 includes a common electrode pattern 102*a* and a gate pattern 102 of thin film transistors, and the second electrically conductive layer 13 includes a source electrode pattern 100*a*, a drain electrode pattern 100*b* of the thin film transistors and leading wires thereof. The first connection portion is in electrical contact with the common electrode pattern of the first electrically conductive layer. The insulating layer 12 includes a gate insulating layer 103, or a gate insulating layer 103 and an etch barrier layer 104. In a further embodiment, the array substrate further includes a passivation layer 107 formed on the insulating layer 13 (such as, the gate insulating layer 103 or the gate insulating layer 103 and the etch barrier layer 104), a portion of the passivation layer 107 corresponding to the first connection portion 106 is removed to expose the first connection portion 106. In another embodiment, the array substrate further includes at least one common electrode connection lines 108 formed on the passivation layer 107 and each being in electrical connection with the first connection portion 106 in the at least one common holes 105.

In an embodiment, for example, in a top-gate array substrate, the first electrically conductive layer 11 includes the source electrode pattern 100*a*, the drain electrode pattern 100*b* of the thin film transistor and the leading wires thereof and the second electrically conductive layer 13 includes the gate pattern 102*a* of the thin film transistors. The insulating layer 12 includes the gate insulating layer 103. In a still embodiment, the array substrate further includes a passivation layer formed on the second electrically conductive layer 13, and a portion of the passivation layer corresponding to the first connection portion 106 is removed to expose the first connection portion 106. In another embodiment, the array substrate further includes a pixel electrode pattern and/or a data line pattern, which are respectively in electrical connection with the drain electrode pattern 100*b* and/or the source electrode pattern 100*a* through the common holes 105 and the first connection portion 106 in the common holes 105, formed on the passivation layer. In a preferred embodiment, the array substrate further includes the pixel electrode pattern and the data line pattern formed on the passivation layer and being respectively in electrical connection with the drain electrode pattern 100b and the source electrode pattern 100a through the common holes 105 and the first connection portion 106 and the second connection portion 106a in the common holes 105.

With the array substrate provided by the above embodiments of the present disclosure, the first connection portion that is in electrical contact with the common electrode pattern is formed in the common holes such that a hole depth of the common holes is reduced due to the thickness of the first connection portion while maintaining electrical communication from the first connection portion to the electrically conductive layer, thereby reducing section drop of the common holes, alleviating problem of poor diffusion of PI solution or metal solution at edges of the common holes and further reducing panel stain. In addition, as the first connection portion is formed in the common holes while forming the source electrode pattern, the drain electrode pattern of the thin film transistor and the leading wires thereof, i.e., the source electrode pattern, the drain electrode pattern of the thin film transistor and the connection portion in the common holes are formed through a single process such that the first connection portion is electrically connected with the common electrode pattern and has the same thickness as those of the source electrode and drain electrode of the thin film transistor. Thus, no additional step is needed, and thus no product cost and time is increased.

According to a still another aspect, there is further provided a display device according to an embodiment of the present disclosure, and the display device includes the array substrate according to any of the above embodiments. The display device may be a liquid crystal display device, or may be an OLED display device, in which the liquid crystal display device may be a liquid crystal display, a liquid crystal television, a mobile phone, a flat computer or product or component that has a display function, and is not limited in the present disclosure.

The above description is only specific embodiments of the present disclosure and however the protective scope of the present disclosure is not limited to this. Change or replacement that is obvious to be obtained within the scope of the present disclosure shall be covered in the protective scope of the present disclosure. Thus, the protective scope of the present invention should be defined by the claims.

What is claimed is:

1. A method of manufacturing an array substrate, the method comprising a step of forming thin film transistors on a substrate; wherein the step of forming the thin film transistors on the substrate comprises:
   forming a first electrically conductive layer on the substrate;
   forming an insulating layer on the first electrically conductive layer;
   forming at least one common holes in the insulating layer to communicate with the first electrically conductive layer;
   forming a first connection portion, which is made of the same material as a second electrically conductive layer, in the at least one of the at least one common holes while forming the second electrically conductive layer on the insulating layer by using a single process, the first connection portion being in electrical contact with the first electrically conductive layer, wherein the first electrically conductive layer includes a common electrode pattern and a gate pattern of the thin film transistors, and the second electrically conductive layer includes a source electrode pattern and a drain electrode pattern of the thin film transistors and leading wires thereof,
   the step of forming the first connection portion, which is made of the same material as the second electrically conductive layer, in at least one of the at least one common holes while forming the second electrically conductive layer on the insulating layer comprises:
   forming the source electrode pattern and the drain electrode pattern of the thin film transistors and the leading wires thereof from metal material while forming the first connection portion in the at least one common holes from the metal material, the first connection portion being in electrical contact with the common electrode pattern.

2. The method according to claim 1, wherein the insulating layer comprises a gate insulating layer, or comprises a gate insulating layer and an etch barrier layer,
   the step of forming the at least one common holes in the insulating layer to communicate with the first electrically conductive layer comprises:
   forming an active layer pattern at a location, corresponding to the gate pattern, on the gate insulating layer;
   forming the etch barrier layer on the substrate obtained;
   forming at least one common holes, at locations of the etch barrier layer corresponding to the common electrode pattern, the at least one common holes being communicated with the common electrode pattern.

3. The method according to claim 1 further comprising steps of:
   forming a passivation layer on the second electrically conductive layer, the passivation layer covering the first connection portion;
   etching a portion of the passivation layer corresponding to the first connection portion to expose the first connection portion; and
   forming at least one common electrode connection lines on the passivation layer, the common electrode connection lines each being in electrical connection with the first connection portion in the at least one common holes.

4. A method of manufacturing an array substrate, the method comprising a step of forming thin film transistors on a substrate; wherein the step of forming the thin film transistors On the substrate comprise:
   forming a first electrically conductive layer on the substrate;
   forming an insulating layer on the first electrically conductive layer;
   forming at least one common holes in the insulating layer to communicate with the first electrically conductive layer;
   forming a first connection portion, which is made of the same material as a second electrically conductive layer, in the at least one of the at least one common holes while forming the second electrically conductive layer on the insulating layer by using a single process, the first connection portion being in electrical contact with the first electrically conductive layer, wherein the first electrically conductive layer comprises the source electrode pattern and the drain electrode pattern of the thin film transistors and the leading wires thereof, and the second electrically conductive layer comprises a gate pattern of the thin film transistors,
   the step of forming the first connection portion, which is made of the same material as the second electrically conductive layer, in at least one of the at least one common holes while forming the second electrically conductive layer on the insulating layer comprises:

forming the first connection portion from the metal material in at least one of the at least one common holes while forming the gate pattern of the thin film transistors from the metal material, the first connection portion being in electrical contact with one of the source electrode pattern and the drain electrode pattern of the thin film transistors.

5. The method according to claim 4, further comprising a step of: forming a second connection portion from the same material as the second electrically conductive layer in the rest of the at least one common holes while forming the second electrically conductive layer on the insulating layer.

6. The method according to claim 5, wherein the step of forming the second connection portion from the same material as the second electrically conductive layer in the rest of the at least one common holes while forming the second electrically conductive layer on the insulating layer comprises:

forming the second connection portion from the metal material in the rest of the at least one common holes while forming the gate pattern of the thin film transistors from the metal material, the second connection portion being in electrical contact with the other of the source electrode pattern and the drain electrode pattern.

7. The method according to claim 4, wherein the insulating layer comprises a gate insulating layer, the step of forming the at least one common holes in the insulating layer to communicate with the first electrically conductive layer comprises:

forming the at least one common holes at locations of the gate insulating layer corresponding to the source electrode pattern and the drain electrode pattern to communicate with the source electrode pattern and the drain electrode pattern of the thin film transistors.

8. The method according to claim 7, further comprising:

forming a passivation layer on the second electrically conductive layer, the passivation layer covering the first connection portion;

etching and removing a portion of the passivation layer corresponding to the first connection portion to expose the first connection portion; and forming a pixel electrode pattern and/or a data line pattern, which are respectively in electrical connection with the drain electrode pattern and/or the source electrode pattern of the thin film transistors through the common holes and the first connection portion in the common holes, on the passivation layer.

9. The method according to claim 8, wherein the pixel electrode pattern and the data line pattern are formed on the passivation layer and are respectively in electrical connection with the drain electrode pattern and the source electrode pattern through the common holes and the first connection portion and the second connection portion in the common holes.

* * * * *